(12) United States Patent
Woelfl

(10) Patent No.: US 11,852,543 B2
(45) Date of Patent: Dec. 26, 2023

(54) METHOD AND ELECTRONIC ASSEMBLY FOR DETERMINING A TEMPERATURE OF AT LEAST ONE ELECTRONIC SWITCHING ELEMENT

(71) Applicant: Bayerische Motoren Werke Aktiengesellschaft, Munich (DE)

(72) Inventor: Gerhard Woelfl, Geltendorf (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 540 days.

(21) Appl. No.: 16/502,251

(22) Filed: Jul. 3, 2019

(65) Prior Publication Data
US 2019/0323900 A1 Oct. 24, 2019

Related U.S. Application Data

(63) Continuation of application No. PCT/EP2018/056524, filed on Mar. 15, 2018.

(30) Foreign Application Priority Data

Apr. 3, 2017 (DE) .................... 10 2017 205 625.8

(51) Int. Cl.
*G01K 7/01* (2006.01)
*H03K 17/0812* (2006.01)
*H03K 17/08* (2006.01)

(52) U.S. Cl.
CPC .......... *G01K 7/01* (2013.01); *H03K 17/08122* (2013.01); *G01K 2217/00* (2013.01); *H03K 2017/0806* (2013.01)

(58) Field of Classification Search
CPC .. G01K 7/00; G01K 7/01; G01K 7/16; G01K 7/183; G01K 7/20; G01K 7/22;
(Continued)

(56) References Cited

U.S. PATENT DOCUMENTS 7,255,476 B2  8/2007  Franch et al.
7,452,128 B2  11/2008 Franch et al.
(Continued)

FOREIGN PATENT DOCUMENTS

CN  103226044 A  7/2013
CN  103604517 A  2/2014
(Continued)

OTHER PUBLICATIONS

Chinese-language Office Action issued in Chinese Application No. 201880005792.8 dated May 19, 2020 with English translation (18 pages).

(Continued)

*Primary Examiner* — Levi Gannon
(74) *Attorney, Agent, or Firm* — Crowell & Moring LLP

(57) ABSTRACT

A method determines a temperature of at least one electronic switching element by way of a temperature measuring circuit. A first electronic switching element in an electronic module is first of all turned off and a second electronic switching element in the electronic module is turned on. A voltage measuring unit is then coupled to the electronic module and a voltage drop across the second electronic switching element is measured. A current intensity of a current flowing through the second electronic switching element is also determined and the temperature of the second electronic switching element is determined with the inclusion of the measured voltage drop and the determined current intensity. An electronic assembly for determining a temperature of at least one electronic switching element is also described.

11 Claims, 2 Drawing Sheets

(58) Field of Classification Search
CPC .... G01K 13/00; G01K 2217/00; H03K 17/00; H03K 17/08122; H03K 2017/0806
USPC .......................................................... 374/185
See application file for complete search history.

(56) References Cited

U.S. PATENT DOCUMENTS

| | | |
|---|---|---|
| 7,780,347 B2 | 8/2010 | Franch et al. |
| 2003/0141920 A1 | 7/2003 | Schrodinger et al. |
| 2004/0217744 A1* | 11/2004 | Walters ............... H02M 3/1588 323/277 |
| 2005/0232333 A1 | 10/2005 | Franch et al. |
| 2011/0157944 A1 | 6/2011 | Jiang |
| 2014/0314124 A1 | 10/2014 | Ash et al. |
| 2015/0377717 A1* | 12/2015 | Rollin ..................... G01K 7/01 318/400.26 |
| 2016/0071972 A1 | 3/2016 | Krischke et al. |
| 2016/0116345 A1* | 4/2016 | Furtner ................... G01K 7/01 374/178 |
| 2019/0204889 A1* | 7/2019 | Kaeriyama ............. H02P 29/68 |

FOREIGN PATENT DOCUMENTS

| | | |
|---|---|---|
| CN | 103674299 A | 3/2014 |
| CN | 105572557 A | 5/2016 |
| CN | 105406850 A | 6/2016 |
| DE | 102 04 487 A1 | 8/2003 |
| DE | 10 2010 000 875 A1 | 7/2011 |
| DE | 11 2014 000 951 T5 | 11/2015 |
| DE | 10 2015 218 912 A1 | 3/2017 |
| EP | 1 973 025 A1 | 9/2008 |

OTHER PUBLICATIONS

International Search Report (PCT/ISA/210) issued in PCT Application No. PCT/EP2018/056524 dated May 17, 2018 with English translation (five (5) pages).

German-language Written Opinion (PCT/ISA/237) issued in PCT Application No. PCT/EP2018/056524 dated May 17, 2018 (eight (8) pages).

German-language Search Report issued in counterpart German Application No. 10 2017 205 625.8 dated Dec. 7, 2017 with partial English translation (10 pages).

* cited by examiner

METHOD AND ELECTRONIC ASSEMBLY FOR DETERMINING A TEMPERATURE OF AT LEAST ONE ELECTRONIC SWITCHING ELEMENT

CROSS REFERENCE TO RELATED APPLICATIONS

This application is a continuation of PCT International Application No. PCT/EP2018/056524, filed Mar. 15, 2018, which claims priority under 35 U.S.C. § 119 from German Patent Application No. 10 2017 205 625.8, filed Apr. 3, 2017, the entire disclosures of which are herein expressly incorporated by reference.

BACKGROUND AND SUMMARY OF THE INVENTION

The invention relates to a method for determining a temperature of at least one electronic switching element, and to an electronic assembly for determining a temperature of at least one electronic switching element.

In electronic switching elements used in circuits or electronic modules, switching losses and ohmic losses in respect of the electrical power occur during operation. These losses are converted into heat, as a result of which the temperature of the electronic switching elements rises.

Particularly in the case of highly loaded and/or rapidly switching electronic switching elements, it is important to monitor the temperature since an excessively high temperature can impair or damage the switching elements. In the worst case, it is even possible for failure of the corresponding switching element to occur.

In a customary method for measuring the temperature of an electronic switching element, a thermistor is installed in the vicinity thereof. In order to ascertain the temperature of the electronic switching element, the ohmic resistance of the thermistor is determined, from which the temperature of the electronic switching element can be derived.

In this way, however, the temperature of the electronic switching element is not measured in an inner region, crucial for the function, but rather outside this region. Since large temperature differences may prevail between the inner region and an outer region of the electronic switching elements, the result of the measurement of the temperature has possibly only limited meaningfulness.

This is the case, in particular, if a cooler is provided for the circuit or the electronic assembly, in particular the electronic switching elements. The switching elements are then cooled by the cooler in the outer region, while higher temperatures may be present in the inner region of the switching elements. In this case, during a measurement by way of the separately embodied thermistor, a temperature is ascertained which is lower than the actual temperature present in the inner region of the switching element, since the separately embodied thermistor is likewise cooled by the cooler.

The object of the invention is to provide a method and an assembly with which the temperature of an electronic switching element is determinable more accurately.

According to the invention, a method is provided for determining a temperature of at least one electronic switching element by way of a temperature measuring circuit comprising at least one electronic module having a first electronic switching element and a second electronic switching element, wherein the electronic switching elements are configured such that they block a current flow in one direction in a first switching position. The method comprises the following steps:

a) turning off the first electronic switching element and turning on the second electronic switching element;
b) coupling a voltage measuring unit to the electronic module;
c) measuring a voltage drop across the second electronic switching element;
d) determining the current intensity of a current flowing through the second electronic switching element; and
e) ascertaining the temperature of the second electronic switching element with the inclusion of the measured voltage drop and the determined current intensity.

During step c) described above, only a low voltage is dropped across the second electronic switching element. The voltage measuring unit is fashioned in particular in such a way that it resolves the voltage drop across the second electronic switching element with a desired accuracy.

The voltage measuring unit is coupled to the electronic module only after the second electronic switching element has been decoupled from a link circuit voltage in step a) by virtue of the first electronic switching element having been turned off. As a result, the voltage measuring unit need not be dimensioned for voltages of the order of magnitude of the link circuit voltage, such that the voltage drop across the second electronic switching element can be measured precisely enough.

In accordance with one aspect, an electronic switching unit is provided, which is configured in such a way that it blocks a current flow in one direction in a first switching position, wherein the electronic switching unit is turned on in order to couple the voltage measuring unit to the electronic module. In this way, the voltage measuring unit can be coupled to the electronic module in a particularly simple manner, in particular by way of an electrical driving pulse. The electronic switching unit additionally ensures that the voltage measuring unit can be rapidly decoupled from the electronic module, as a result of which it can be protected against an excessively high voltage, for example the link circuit voltage.

A further aspect provides for at least one of the two electronic switching elements and/or the switching unit to be driven by a controller, in particular the two electronic switching elements and the switching unit. As a result, switchover steps can be controlled automatically and with high precision. In particular, the switchover steps of the individual components can be coordinated with one another.

In accordance with one aspect of the invention, after step d), the voltage measuring unit is decoupled from the electronic module before the second electronic module is turned off and the first electronic switching element is turned on. As a result, the voltage measuring unit is decoupled from the electronic module before the link circuit voltage would be present at the voltage measuring unit. A voltage of this order of magnitude could damage or, in the worst case, destroy the voltage measuring unit. After step d), at least one further intermediate step can be provided before the voltage measuring unit is decoupled from the electronic module.

In accordance with another aspect of the invention, provision is made for a resistance value of the first electronic switching element to be determined from the measured voltage drop and the determined current intensity, in particular wherein the resistance value is used for determining the temperature of the second electronic switching element.

As a result, in contrast to the prior art, the actual temperature of the electronic switching element to be investigated can be determined.

In particular, the temperature is ascertained on the basis of a functional relationship or is taken from a table of values. As a result, the temperature can be derived directly from the determined resistance and the determined current intensity or the measured voltage.

The electronic switching unit can comprise a field effect transistor, in particular a MOSFET, for example an SiC MOSFET. Since the electronic switching unit has to switch over very precisely and rapidly, MOSFETs, which generally switch very rapidly, are particularly well suited to this.

In accordance with one aspect of the invention, the current intensity of the current flowing through the second electronic switching element is determined by way of the measurement of a current through a load, in particular through an inductor. Since this current intensity is measured anyway in customary applications of the electronic module, no additional outlay for current measurement arises.

According to an aspect of the invention, an electronic assembly is provided for determining a temperature of at least one electronic switching element. The electronic assembly comprises at least one electronic module having a first electronic switching element and a second electronic switching element. An electronic switching unit is provided, which is turned off in a first switching position and is turned on in a second switching position, such that a voltage measuring unit is coupled to the electronic module in such a way that the voltage measuring unit taps off a voltage across the second electronic switching element. A current measuring unit is provided, which is configured to measure the current intensity of a current flowing through the second electronic switching element. And, a control and evaluation unit is provided, which is configured to process the measured voltage and the determined current intensity in order to determine the temperature of the second electronic switching element.

This construction of the electronic assembly makes it possible to determine the actual temperature of the second electronic switching element during the operation of the electronic module without an interruption of operation. Consequently, the temperature of the electronic switching element to be investigated is not deduced by way of a component separate therefrom.

The electronic assembly is configured, in particular, to carry out the method described above.

A further aspect of the invention provides for the electronic switching unit to be coupled to the electronic module via an electrical line, wherein the electrical line branches off from the electronic module between the first electronic switching element and the second electronic switching element. As a result, the voltage measuring unit can tap off the voltage dropped across the second electronic switching element.

Other objects, advantages and novel features of the present invention will become apparent from the following detailed description of one or more preferred embodiments when considered in conjunction with the accompanying drawings.

DETAILED DESCRIPTION OF THE DRAWINGS

The construction of an electronic assembly 10 for determining a temperature of at least one electronic switching element is explained below with reference to FIG. 1.

Figure 1:
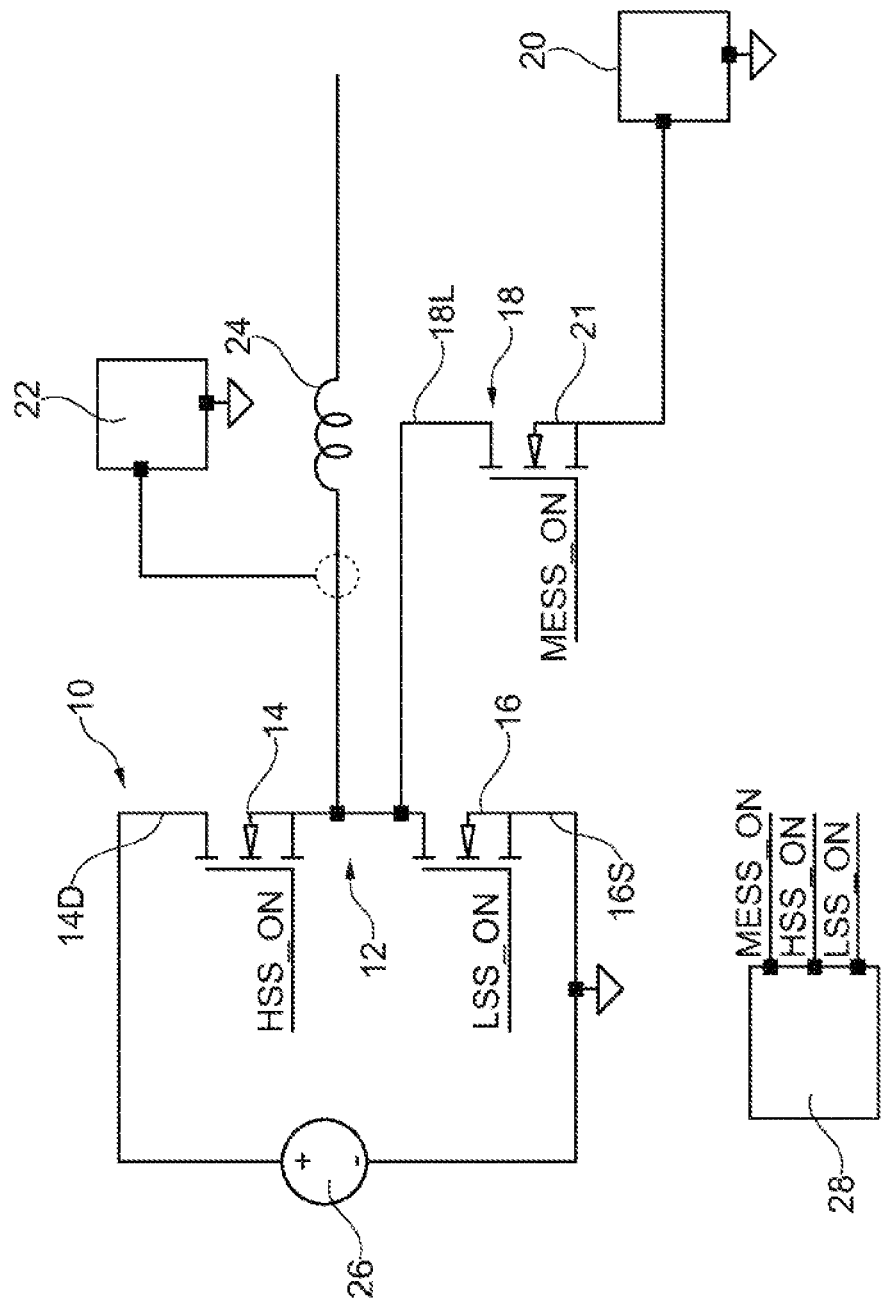
FIG. 1 is a circuit diagram of an electronic assembly according to an embodiment of the invention.

FIG. 1 shows a circuit diagram of the electronic assembly 10, which has a temperature measuring circuit for the electronic switching element. The electronic assembly 10 comprises an electronic module 12 having a first electronic switching element 14 and a second electronic switching element 16.

The electronic assembly 10 furthermore comprises an electronic switching unit 18, via which a voltage measuring unit 20 is able to be coupled to the electronic module 12.

The electronic switching unit 18 is connected to the electronic module 12 via an electrical line 18L. The electrical line 18L branches off between the first electronic switching element 14 and the second electronic switching element 16.

In the embodiment shown, the electronic switching unit 18 has an electronic switching element 21 configured as a MOSFET, to put it more precisely as a normally off n-channel MOSFET. In particular, an SiC MOSFET is involved.

Moreover, a current measuring unit 22 is provided, which is designed to determine the current intensity of a current through the second electronic switching element 16.

The voltage measuring unit 20 and the current measuring unit 22 can each comprise an analog-to-digital converter, such that the analog input signals are digitized.

Moreover, in the embodiment shown, an inductive component 24, in particular an inductor, is connected in series with the current measuring unit 22.

The electronic switching elements 14, 16 are configured for example as MOSFETs, to put it more precisely as normally off n-channel MOSFETs. In particular, SiC MOSFETs are involved. A drain terminal 14D of the first (high-side) electronic switching element 14 is connected to a positive pole of a DC source 26. In addition, a source terminal 16S of the second (low-side) electronic switching element 16 is connected to a negative pole of the DC source 26.

A control and evaluation unit 28 is additionally provided, which drives the two electronic switching elements 14, 16 and the electronic switching unit 18 via electrical lines (not illustrated more specifically). In addition, via lines (not illustrated here), the control and evaluation unit 28 obtains the measurement results of the voltage measuring unit 20 and the current measuring unit 22 in order correspondingly to evaluate them, as will also be explained below.

Electrical lines and electronic components additionally required for the operation of the electronic module 12 are not shown in FIG. 1 for reasons of clarity.

A method for determining a temperature of at least one electronic switching element by way of the temperature measuring circuit described above is described below with reference to FIGS. 1 to 3.

For determining the temperature of the second electronic switching element 16, firstly the first electronic switching element 14 is turned off and the second electronic switching element 16 is turned on. This is also referred to as step a). Step a) is carried out at a time $t_I$ (see FIG. 2).

After step a), the second electronic switching element 16 is decoupled from the DC source 26. Therefore, a link circuit voltage $U_{ZK}$ of the DC source 26 is no longer present at the second electronic switching element 16.

The voltage measuring unit 20 is then coupled to the electronic module 12, which is referred to as step b). The coupling is effected by the electronic switching unit 18 being turned on, in particular the switching element 21 thereof.

A voltage drop $U_{DS}$ between drain and source terminals of the second electronic switching element 16 is then measured by means of the voltage measuring unit 20, which is referred to as step c).

The voltage drop between drain and source terminals of the second electronic switching element 16 is dependent on the temperature of the second electronic switching element 16 since the ohmic resistance thereof is temperature-dependent.

The voltage measuring unit 20 is designed, in particular, to measure the voltage drop $U_{DS}$ so accurately that differences in the voltage drop $U_{DS}$ at different temperatures of the second electronic switching element 16 are resolvable.

Figure 2:
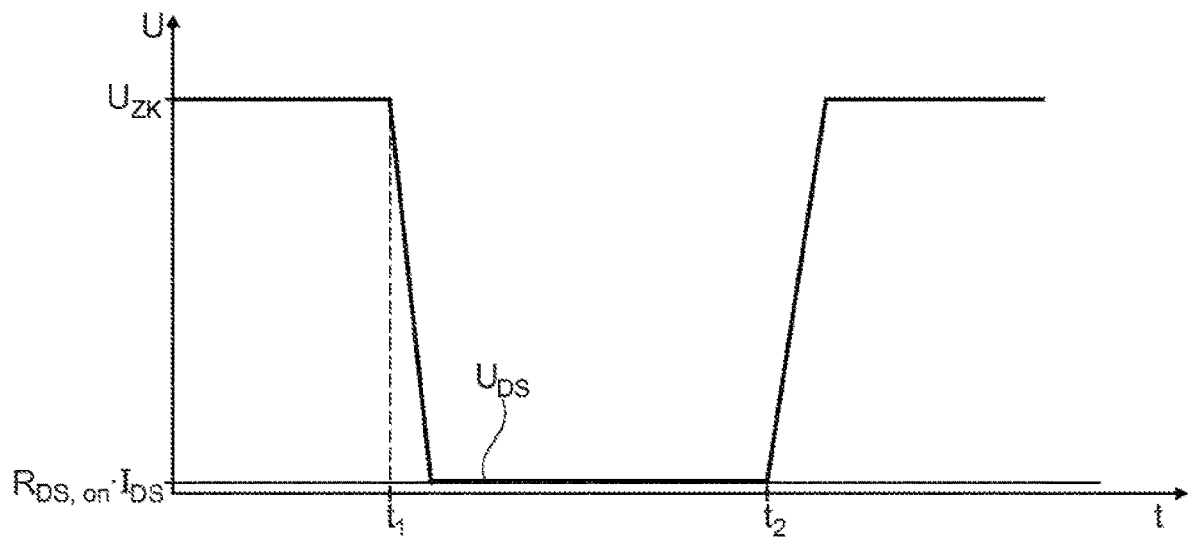
FIG. 2 is a graph showing a temporal profile of a drain-source voltage across the second electronic switching element of the electronic assembly in accordance with FIG. 1.

As can be seen in FIG. 2, the voltage drop $U_{DS}$ after step a), that is to say at times greater than $t_I$ (see FIG. 2), is significantly less than the link circuit voltage $U_{ZK}$ of the DC source 26. Differences in the voltage drop $U_{DS}$ at different temperatures are therefore smaller than the link circuit voltage $U_{ZK}$ potentially by a plurality of orders of magnitude.

Therefore, in step a), the second electronic switching element 16 is decoupled from the DC voltage source 26 before the voltage measuring unit 20 is coupled to the electronic module 12. The link circuit voltage $U_{ZK}$ could otherwise damage the voltage measuring unit 20.

The current intensity of a current $I_{DS}$ flowing through the second electronic switching element 16 is determined by way of the current measuring unit 22, which is reflected as step d). This can be carried out in particular by the measurement of a current that flows through the inductive component 24, in particular proceeds from the latter.

With the inclusion of the measured voltage drop $U_{DS}$ and the determined current intensity of the current $I_{DS}$, the temperature T of the second electronic switching element 16 is then ascertained, in particular by the control and evaluation unit 28, which obtains the measured values of the voltage measuring unit 20 and the current measuring unit 22. This is also referred to as step e).

Step e) is explained in more specific detail below. Firstly, the ohmic resistance $R_{DS,on}$ of the second electronic switching element 16 in the on state is ascertained in accordance with Ohm's law, that is to say by way of:

$$R_{DS,on} = \frac{U_{DS}}{I_{DS}}$$

Since the ohmic resistance $R_{DS,on}$ is temperature-dependent, the temperature T of the second electronic switching element 16 can be ascertained from said ohmic resistance and the determined current intensity $I_{DS}$.

If the functional relationship between the temperature T, the ohmic resistance $R_{DS,on}$ and the determined current intensity $I_{DS}$ is known, then the temperature of the second electronic switching element 16 can be calculated in accordance with the following formula:

$$T = f(R_{DS,on}, I_{DS})$$

In this case, f is a function which assigns a temperature to pairs of values $(R_{DS,on}, I_{DS})$.

Alternatively, the temperature T can be read from a table of values that assigns a temperature to the pairs of values $(R_{DS,on}, I_{DS})$.

Analogously to the explanations above, the temperature of the second electronic switching element 16 can also be determined from the ohmic resistance $R_{DS,on}$ and the measured voltage drop $U_{DS}$.

If the functional relationship is known, then the temperature of the second electronic switching element 16 can be calculated in accordance with the following formula:

$$T = g(R_{DS,on}, U_{DS})$$

In this case, g is a function that assigns a temperature T to pairs of values $(R_{DS,on}, U_{DS})$.

Alternatively, the temperature T can be read from a table of values that assigns a temperature to the pairs of values $(R_{DS,on}, U_{DS})$.

Likewise analogously to the explanations above, the temperature of the second electronic switching element 16 can also be determined directly from the measured voltage drop $U_{DS}$ and the determined current intensity $I_{DS}$.

If the functional relationship is known, the temperature of the second electronic switching element 16 can be calculated in accordance with the following formula:

$$T = h(U_{DS}, I_{DS})$$

In this case, h is a function that assigns a temperature T to the pairs of values $(U_{DS}, I_{DS})$.

Alternatively, the temperature T can be read from a table of values that assigns a temperature to the pairs of values $(U_{DS}, I_{DS})$.

The control and evaluation unit 28 can be fashioned in such a way that it automatically carries out the method described above and, in particular, automatically determines the temperature of the second electronic switching element 16.

The method can analogously also be applied for measuring a temperature of the first electronic switching element 14. In this case, a voltage measuring unit 20 is then able to be coupled to the electronic module 12 via an electronic switching unit 18 in such a way that the voltage measuring unit 20 taps off a voltage across the first electronic switching element 14.

The voltage measuring unit 20 is then only coupled to the electronic module 12 if the first electronic switching element 14 is turned on and the second electronic switching element 16 is turned off.

Otherwise, reference is made to the explanations above.

Figure 3:
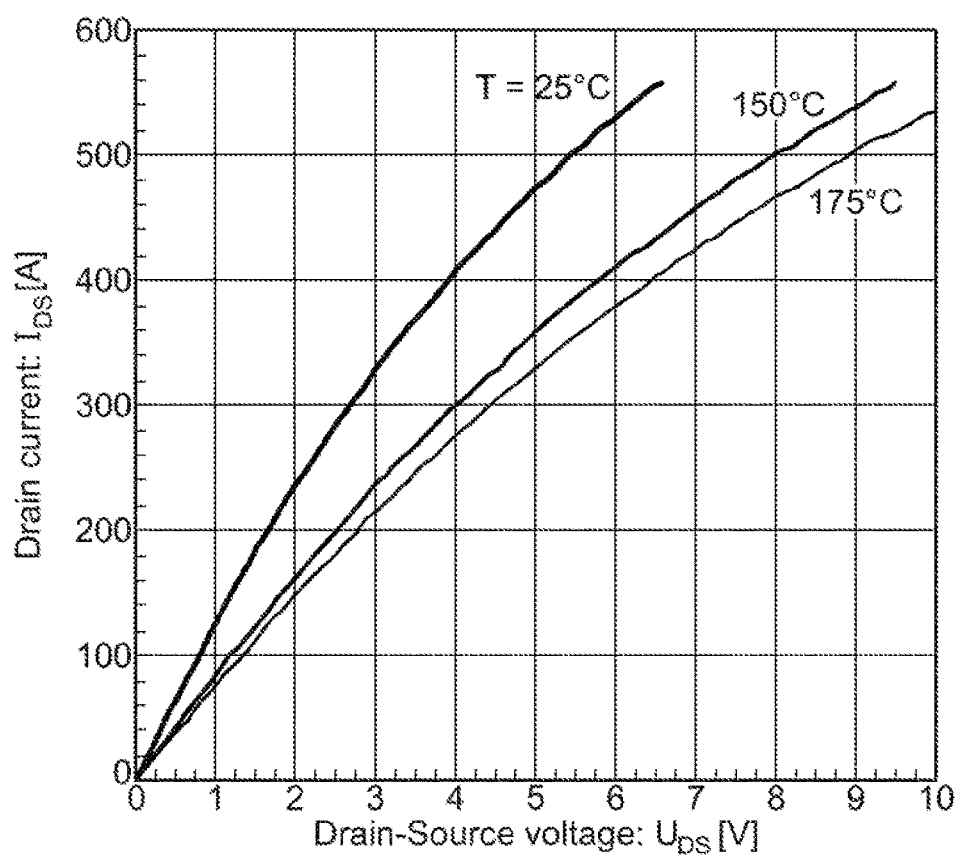
FIG. 3 is a graph showing a family of characteristic curves of the second electronic switching element of the electronic assembly in accordance with FIG. 1.

FIG. 3 shows a diagram in which the measured current intensity $I_{DS}$ is plotted against the measured voltage drop $U_{DS}$ for three different temperatures, namely for 25° C., 150° C. and 175° C. The temperature dependence of the measured values is evident from the diagram. This makes it clear that the temperature of the electronic switching element can correspondingly be determined by way of the measured values.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for determining a temperature of at least one electronic switching element by a temperature measuring circuit comprising at least one electronic module having a first electronic switching element and a second electronic switching element, wherein the first and second electronic switching elements are configured so as to block a current flow in one direction in a first switching position, the method comprising the steps of:
   a) turning off the first electronic switching element and turning on the second electronic switching element;
   b) coupling a voltage measuring unit to the electronic module;
   c) measuring a voltage drop across the second electronic switching element;
   d) measuring a current intensity of a current flowing through the second electronic switching element; and
   e) ascertaining the temperature of the second electronic switching element based on a resistance of the second electrical switching element, wherein the resistance is determined based on the measured voltage drop and the measured current intensity, wherein:
   the current intensity of the current flowing through the second electronic switching element is measured by way of measurement of a current through a load, and the load is an inductor.

2. The method according to claim 1, further comprising the step of:
   turning on an electronic switching unit in order to couple the voltage measuring unit to the electronic module, wherein
   the electronic switching unit is configured so as to block a current flow in one direction in a first switching position.

3. The method according to claim 2, further comprising the step of:
   driving, via a controller, at least one of the first and second electronic switching elements and/or the electronic switching unit.

4. The method according to claim 2, further comprising the step of:
   driving, via a controller, both the first and second electronic switching elements and the electronic switching unit.

5. The method according to claim 2, wherein
   at least the electronic switching unit comprises a field effect transistor.

6. The method according to claim 5, wherein
   the field effect transistor is a MOSFET.

7. The method according to claim 5, wherein
   the field effect transistor is an SiC MOSFET.

8. The method according to claim 1, wherein
   after step d), the voltage measuring unit is decoupled from the electronic module before the second electronic switching element is turned off and the first electronic switching element is turned on.

9. The method according to claim 1, wherein
   the temperature is ascertained on the basis of a functional relationship or is taken from a table of values.

10. An electronic assembly for determining a temperature of at least one electronic switching element, comprising:
    at least one electronic module having a first electronic switching element and a second electronic switching element, wherein
    an electronic switching unit is provided, which is turned off in a first switching position and is turned on in a second switching position, such that a voltage measuring unit is coupled to the electronic module such that the voltage measuring unit measures a voltage drop across the second electronic switching element,
    a current measuring unit is provided, which is configured to measure the current intensity of a current flowing through the second electronic switching element by way of measurement of a current through a load, wherein the load is an inductor, and
    a control and evaluation unit is provided, which is designed to process the measured voltage and the measured current intensity in order to determine a resistance of the second electrical switching element, and to determine the temperature of the second electronic switching element based on the resistance of the second electrical switching element.

11. The electronic assembly according to claim 10, wherein
    the electronic switching unit is coupled to the electronic module via an electrical line, and
    the electrical line branches off from the electronic module between the first electronic switching element and the second electronic switching element.

* * * * *